United States Patent
Becker et al.

(10) Patent No.: US 9,540,271 B2
(45) Date of Patent: Jan. 10, 2017

(54) BLANK MADE OF TITANIUM-DOPED SILICA GLASS AND METHOD FOR THE PRODUCTION THEREOF

(71) Applicant: Heraeus Quarzglas GmbH & Co. KG, Hanau (DE)

(72) Inventors: Klaus Becker, Hanau (DE); Stefan Ochs, Gelnhausen (DE); Stephan Thomas, Grosskrotzenburg (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 14/748,344

(22) Filed: Jun. 24, 2015

(65) Prior Publication Data

US 2015/0376048 A1 Dec. 31, 2015

(30) Foreign Application Priority Data

Jun. 27, 2014 (EP) .................. 14174699

(51) Int. Cl.
*C03C 3/06* (2006.01)
*C03B 23/04* (2006.01)
(Continued)

(52) U.S. Cl.
CPC ............ *C03B 23/04* (2013.01); *C03B 19/066* (2013.01); *C03B 19/1453* (2013.01);
(Continued)

(58) Field of Classification Search
CPC ........................ C03C 2201/06; C03C 2201/42
(Continued)

(56) References Cited

U.S. PATENT DOCUMENTS 8,137,469 B2 * 3/2012 Hawtof ............... C03B 19/1423
118/725
2007/0130995 A1 * 6/2007 Hawtof ............... C03B 19/1423
65/377
(Continued)

FOREIGN PATENT DOCUMENTS

DE       4204406 A1    8/1993
DE  102004024808 A1   12/2005
(Continued)

OTHER PUBLICATIONS

Extended Search Report issued Dec. 16, 2014 in European Application No. 14174699.0.

*Primary Examiner* — Noah Wiese
(74) *Attorney, Agent, or Firm* — Panitch Schwarze Belisario & Nadel LLP

(57) ABSTRACT

A blank made of titanium-doped silica glass for a mirror substrate for use in EUV lithography is provided. The blank includes a surface portion to be provided with a reflective film and having an optically used area (CA) over which a coefficient of thermal expansion (CTE) has a two-dimensional inhomogeneity (dCTE) distribution profile averaged over a thickness of the blank. A maximum inhomogeneity ($dCTE_{max}$) of less than 5 ppb/K is defined as a difference between a CTE maximum value and a CTE minimum value. The $dCTE_{max}$ is at least 0.5 ppb/K. The CA forms a non-circular area having a centroid. The dCTE distribution profile is not rotation-symmetrical and is defined over the CA, such that straight profile sections normalized to a unit length and extending through the centroid of the area yield a dCTE family of curves forming a curve band with a bandwidth of less than $0.5 \times dCTE_{max}$.

20 Claims, 10 Drawing Sheets

(51) Int. Cl.
  *C03B 19/14* (2006.01)
  *G03F 1/24* (2012.01)
  *C03B 19/06* (2006.01)
  *G03F 7/20* (2006.01)

(52) U.S. Cl.
  CPC ............ *C03B 19/1469* (2013.01); *C03C 3/06* (2013.01); *G03F 1/24* (2013.01); *G03F 7/7095* (2013.01); *G03F 7/70316* (2013.01); *C03B 2201/06* (2013.01); *C03B 2201/075* (2013.01); *C03B 2201/42* (2013.01); *C03C 2201/42* (2013.01); *C03C 2203/10* (2013.01); *C03C 2203/50* (2013.01)

(58) Field of Classification Search
  USPC .......................................................... 501/54
  See application file for complete search history.

(56) References Cited

U.S. PATENT DOCUMENTS

| 2007/0137252 | A1* | 6/2007 | Maxon | ................ C03B 19/1453 65/384 |
| 2010/0003609 | A1 | 1/2010 | Maida et al. | |
| 2012/0183719 | A1* | 7/2012 | Kuehn | ................ C03B 19/1453 428/67 |

FOREIGN PATENT DOCUMENTS

| DE | 102010009589 A1 | 9/2011 |
| DE | 102013101328 B3 | 2/2014 |
| WO | 2011104257 A1 | 9/2011 |
| WO | 2014122111 A2 | 8/2014 |

\* cited by examiner

BLANK MADE OF TITANIUM-DOPED SILICA GLASS AND METHOD FOR THE PRODUCTION THEREOF

BACKGROUND OF THE INVENTION

In one embodiment, the present invention relates to a blank made of titanium-doped silica glass for a mirror substrate for use in EUV lithography, with a surface portion to be provided with a reflective film and having an optically used area CA over which the coefficient of thermal expansion CTE has a two-dimensional dCTE distribution profile averaged over the thickness of the blank with a maximum inhomogeneity $dCTE_{max}$ of less than 5 ppb/K defined as a difference between a CTE maximum value and a CTE minimum value.

Furthermore, in one embodiment, the present invention relates to a method for producing such a blank from titanium-doped glass (quartz glass) having a high silicic-acid content for a mirror substrate for use in EUV lithography.

In EUV lithography, highly integrated structures with a line width of less than 50 nm are produced by means of microlithographic projection devices. Use is here made of working radiation from the spectral range between 10 nm and 121 nm, which is also called EUV range (extreme ultraviolet light, also known as "soft X-ray radiation"). The typical operating wavelength in EUV lithography is 13 nm at the moment.

The projection devices are equipped with mirror elements which consist of synthetic glass having a high silicic-acid content and being doped with titanium dioxide (hereinafter also called "$TiO_2$—$SiO_2$ glass", "Ti-doped silica glass"), and which are provided with a reflective layer system. These materials are distinguished by an extremely low coefficient of thermal expansion (shortly called "CTE" hereinafter; coefficient of thermal expansion). The CTE is a glass property which depends on the thermal history of the glass and on a few other parameters, but mainly on the titanium dioxide concentration. Typical titanium dioxide concentrations are between 6% by wt. and 9% by wt.

The blank of Ti-doped silica glass is mechanically treated to obtain the mirror substrate and is provided with a reflective film to form a mirror element. The mirror element has an optically used area CA (CA stands for "clear aperture") which is specified for each mirror element and impinged by a predetermined radiation profile when used in an EUV projection system. Also in a mirror element blank which is not provided with a reflective film, CA is already defined as a projection onto the blank surface, namely independently of the treatment condition of the blank (before or after mechanical treatment).

The optical specification of the area CA of the optical blank is a design factor which is comparable to other technical design factors in the art, e.g. the load waterline (LWL) which characterizes the length of a boat where it meets the water when loaded to its designed capacity. The design factor is utilized throughout the design and manufacturing of the respective product in order to characterize how well it meets certain performance requirements. It is used to specify the acceptable limits of key parameters that govern system performance, as well as to specify the amount of resources (i.e. time and cost) that must be spent on manufacturing in order to reach the specification.

The maximum (theoretical) reflectivity of such an EUV mirror element is about 70%, so that at least 30% of the radiation energy is absorbed in the mirror coating and in the near-surface region of the mirror substrate and converted into heat. Viewed over the total volume, this therefore yields an inhomogeneous temperature distribution with a temperature difference that under typical operating conditions may amount up to 50° C. and lead to a deformation of the mirror substrate.

To keep this deformation small, it would therefore be desirable that the mirror substrate within a significant volume has a CTE that is around zero throughout the total operating temperature range. In practice, however, it is difficult to satisfy this condition because for a given glass composition the temperature range with a CTE around zero is small.

The temperature at which the CTE is exactly equal to zero is also called temperature of zero crossing or $T_{ZC}$ (temperature of zero crossing). This glass property also depends substantially on the titanium concentration. The concentration is typically adjusted such that the CTE is about zero in the temperature range between 20° C. and 45°.

To reduce imaging errors caused by inhomogeneous temperature distribution in the mirror substrate blank, it is provided in International Application Publication No. WO 2011/078414 A2 that in a blank for a mirror substrate, the concentration of titanium oxide over the thickness of the blank is adapted stepwise or continuously to the temperature distribution occurring during operation, in such a manner that the condition for the zero crossing temperature $T_{ZC}$ is satisfied at every point, i.e., the coefficient of thermal expansion for the locally evolving temperature is substantially equal to zero. This is said to be accomplished in that during production of the glass by flame hydrolysis, the concentration of start substances containing titanium or silicon, respectively, is varied such that a predetermined concentration profile is set in the blank.

It is evident that the reproducible adjustment of a variable, location-dependent titanium dioxide concentration over the volume of the mirror substrate blank is complicated and can be optimized also only for one of many mirrors of the projection device and only for a single specific irradiation constellation.

Another approach is taken in DE 10 2004 024 808 A1, which discloses a quartz glass blank for a mirror substrate of the aforementioned type and a method for the production thereof. The blank of titanium-doped, synthetically produced quartz glass known therefrom is given a cylindrical shape; it has, e.g., a diameter of 300 mm and a thickness of 40 mm. This yields by way of a mechanical treatment a mirror substrate plate which is provided with a reflective film completely or in part.

It is suggested that local homogeneity variances in the coefficient of thermal expansion (hereinafter also called "CTE inhomogeneity" or shortly "dCTE" and defined as the amount of the local deviation from an absolute minimum value $CTE_{min}$ of the CTE distribution profile: ($dCTE=CTE-CTE_{min}$)) should be accepted under certain conditions in favor of a less expensive production method. According to these conditions, the dCTE does not exceed a predetermined limit value and in a measurement over the optically used area CA, it shows an evolution that can be described sufficiently accurately through a small number of low-frequency spherical Zernike polynomials. To be more specific, the known quartz glass blank has the following properties:

a) it contains micro-inhomogeneities caused by local variance of the TiO2 distribution of less than 0.05% TiO2, b) it shows a radial variance of the thermal expansion coefficient over the usable area CA of not more than 0.4 ppb/(K·cm), c) its absolute maximum inhomogeneity in the thermal expansion coefficient dCTEmax on the optically used area CA (averaged over the thickness of the blank) is less than 5 ppb/K, d) where the dCTE evolution over CA can substantially be described by the following Zernike terms:

$$dCTE = C_0^\alpha + C_3^\alpha\left(2\left(\frac{r}{R}\right)^2 - 1\right) + C_8^\alpha\left(6\left(\frac{r}{R}\right)^4 - 6\left(\frac{r}{R}\right)^2 + 1\right) \quad (1)$$

where: $C_0^\alpha <= 5$ ppb/K; r=radial distance from the cylinder axis; R=radius of CA; and C3; C8=adaptation parameters of the terms.

The phrase "can substantially be described by the following Zernike terms" means that after subtraction of the terms, the remaining residual inhomogeneity of the thermal expansion is not more than 0.5 ppb/K (in the original document "dCTE" is designated as "Δα").

U.S. Patent Application Publication No. 2010/0003609 A1 describes the preparation of a Ti-doped glass for photomask substrates for EUV lithography. The substrates show a radial refractive index distribution profile in which preferably the maximum is in the center, even if the blank has polygonal cross section. The polygonal cross-section is produced by way of "outflowing a molten glass mass" of a round rod in a polygonal shape.

DE 42 04 406 A1 describes the preparation of a striae-free body by multi-step forming process comprising a step in which a molten glass mass flows out in a rectangular shape. In this case, an intermediate product having a rectangular cross section is obtained which is finally twisted so as to obtain a rod with round cross section.

DE 10 2013 101 328 B3 describes a blank made of $TiO_2$—$SiO_2$ glass for a mirror substrate for use in EUV lithography. At a mean value of the fictive temperature Tf in the range between 920° C. and 970° C., the glass shows a dependence of its temperature zero crossing $T_{ZC}$ on the fictive temperature $T_f$ that, expressed as differential quotient dTzc/dTf, is less than 0.3.

DE 10 2010 009 589 A1 discloses a method for producing a blank made of Ti-doped silica glass for a mirror substrate for use in EUV lithography, wherein a soot body of titanium-doped $SiO_2$ is produced by means of flame hydrolysis of silicon- and titanium-containing start substances, and whereby the soot body is dried in vacuum by heating to a temperature of at least 1150° C., so that a mean hydroxyl group content of less than 150 wt. ppm is set, the dried soot body is sintered forming a preform of Ti-doped silica glass, and the Ti-doped silica glass is loaded by way of the conditioning process with hydrogen, so that a mean hydrogen content of at least $1\times10^{16}$ molecules/cm$^3$ is obtained.

CTE inhomogeneities that satisfy these conditions show a substantially rotation-symmetrical distribution profile over CA. A mirror substrate blank adapted in this way tolerates comparatively high absolute CTE inhomogeneity values also in case of inhomogeneous heating if the irradiation profiles occurring during use and thus the optically used area CA show a circular symmetry. The known mirror substrate blank is however not suited for use with irradiation profiles having a geometry differing from the circular form.

It is an objective of the present invention to provide a blank of titanium-doped silica glass for a mirror substrate for use in EUV lithography, which blank also without an individually adapted, location-dependent adjustment of the titanium dioxide concentration is designed and suited for use with a non-circular irradiation profile. Furthermore, it is an objective of the present invention to provide a method which permits the reproducible and inexpensive production of such a mirror substrate blank.

BRIEF SUMMARY OF THE INVENTION

As for the mirror substrate blank, starting from a blank of titanium-doped silica glass of the aforementioned type, an objective of embodiments of the present invention is achieved in that $dCTE_{max}$ is preferably at least 0.5 ppb/K, and that CA preferably forms a non-circular area with a centroid of the area, wherein the dCTE distribution profile is not rotation-symmetrical and is defined over CA such that straight profile sections normalized to a unit length and extending through the centroid of the area yield a dCTE family of curves forming a curve band with a bandwidth of less than $0.5 \times dCTE_{max}$.

Apart from the energy density of the radiation impinging on the mirror element, the spatial distribution thereof also determines the optical exposure of the mirror element. The spatial distribution of the radiation is preferably reflected in a first approximation in the geometry of the optically used area CA specified for each mirror element. In contrast to the intrinsic dCTE distribution over the optically used area CA, this distribution itself does not represent a physical property of the mirror element, but it is part of the specification pertaining to the mirror element.

Local deviations of the CTE from a given desired value automatically lead to imaging errors by the mirror element, especially due to heating during operation. As a rule, such errors can be reduced, either by avoiding deviations of the CTE in the region of the optically used area, if possible completely, or, although a certain CTE inhomogeneity is accepted, by optimizing the local distribution thereof in relation to the optical exposure.

The first-mentioned alternative has the advantage that the mirror element can exhibit high quality and usability independently of its specific optical exposure and the CA geometry. However, it requires great efforts in the production of the Ti-doped silica glass and during its thermo-mechanical aftertreatment.

The present invention, however, is meant to prevent this very situation. Therefore, a certain degree of CTE inhomogeneity is allowed in the mirror substrate blank of the invention. This manifests itself in that dCTEmax—i.e. the difference between the absolute CTE maximum value and the absolute CTE minimum value of the CTE distribution profile within CA—is at least 0.5 ppb/K.

The manufacturing efforts for the mirror element are thus smaller, but an adaptation of the dCTE distribution profile to the optical exposure and here particularly to size and geometry of CA is required. With a CA geometry deviating from the circular shape, this adaptation has so far been purely empirical. A systematic method for providing basically suitable adaptations to the optical exposure is not known for these cases. Therefore, it has been difficult upon specification of specific requirements and boundary conditions with respect to the CA to provide the matching mirror substrate blank without empirical measures. Empirical methods, however, do not meet the demands made on a simple and inexpensive industrial production.

Embodiments of the present invention provide a general design principle for the formation of the dCTE distribution profile for a mirror substrate blank if the CA specified for it has a geometry differing from the circular shape.

An aspect of a design principle of the present invention refers to the geometric configuration of the dCTE distribution profile—it is not rotation-symmetrical, but elongated oval, and a further aspect refers to the cooperation between the elongated oval dCTE distribution profile and the optically exposed area CA with a non-circular outline.

The outline of the optically exposed area CA which differs from the circular shape forms a closed curve which is normally convex. The following explanations of the area enclosed by the curve refer to the example of an "oval", but are also equally applicable to non-oval geometries, e.g. in rectangular form with rounded-off edges or in bean or dog bone form. The oval has a length expansion which is greater than its maximum width expansion perpendicular thereto, and no, one or two symmetry axes. The centroid of the area of the oval CA is obtained by way of known geometric considerations, or it is calculated mathematically by integration.

One aspect of a general design principle is concerned with the interaction between the oval shape of CA and the dCTE distribution profile. This interaction manifests itself in that the dCTE distribution profile over CA is designed such that all straight sections through the distribution profile that extend through the centroid of the area of CA have a similar course. Since the length expansion and width expansion of CA (and thus also length expansion and width expansion of the dCTE distribution profile and the corresponding profile sections) are different, the similarity in the courses of different sections can only be detected upon normalization to the same length, e.g. by normalization to the length of the longest profile section through the centroid of the area. The correspondingly normalized profile sections shall also be called "length-normalized profile sections" hereinafter.

This similarity manifests itself under this condition in that any desired length-normalized profile sections yield a dCTE family of curves that form a curve band with a maximum bandwidth of less than $0.5 \times dCTE_{max}$, preferably of less than $0.3 \times dCTE_{max}$. The "maximum bandwidth" is obtained as the maximum difference between a maximum value and a minimum value of the dCTE values at all normalized profile positions along the curve band.

The small maximum bandwidth of the curve band is a measure of the similarity of the length-normalized sections through the dCTE distribution profile, namely independently of the angle of intersection, which as such is typical of a rotation-symmetrical dCTE distribution profile. A rotation-symmetrical distribution profile, however, is not adapted to the oval shape of CA that is here present, and is not suited for solving the technical problem.

The high degree of similarity of the length-normalized sections in the non-rotation symmetrical dCTE distribution profile according to the invention is due to the fact that it is configured such that it can be ascribed to a substantially rotation-symmetrical dCTE distribution profile, namely by stretching a rotation-symmetrical profile in at least one direction. The stretching direction is here designed in the simplest case and preferably such that it extends perpendicular to the axis of rotation symmetry. This kind of deformation shall also be called "lateral deformation" hereinafter.

The design principle is therefore based on a geometric transformation in the case of which one produces from a rotation-symmetrical dCTE distribution profile with a substantially circular shape by lateral deformation a geometrically similar dCTE distribution profile with a non-circular form. By lateral deformation, the dCTE distribution profile in relation to the rotation-symmetrical dCTE distribution is changed not fundamentally and unforeseeably, but is changed mathematically in a substantially reproducible and defined manner. This is also true in the reverse direction of the mathematical inversion of the non-rotation symmetrical distribution profile into a rotation-symmetrical distribution profile.

The dCTE distribution profiles before and after the lateral deformation are "similar" to each other to some extent. The "similarity" of the profiles consists in that essential features of an originally rotation-symmetrical distribution can be found again in the distribution obtained by lateral deformation. These features include the number of the relative and absolute extreme values of the distribution and also their mutual relative position.

For instance, a rotation-symmetrical dCTE distribution profile, as explained in DE 10 2004 024 808 A1 and mathematically described with reference to the above formula (1), is designed in relation to an optical exposure with a circular CA. This profile, transformed on the basis of the above-described design principle of the geometric transformation by lateral deformation into another, non-rotation symmetrical distribution profile, is much better suited also without any further measure for an optical exposure with elongated oval CA than without this deformation process.

Thus, the dCTE distribution profile has a non-rotation symmetrical, non-circular form which ideally can be mathematically described in a biunique manner by stretching a rotation-symmetrical distribution profile in at least one direction. The stretching factor is greater than 1 or smaller than 1.

An optically used area CA in the case of which the intersection line $S_{max}$ through the centroid of the area of CA is longer by at least 20% than the shortest intersection line $S_{min}$ through the centroid of the area ($S_{max} > 1.2 \times S_{min}$) is here defined as non-circular. A distribution profile is defined as the non-rotation symmetrical dCTE distribution profile, in the case of which the adaptation to the non-circular CA is such that the above-explained condition regarding the "similarity" of the profiles is fulfilled owing to the narrow bandwidth of the curve band of the intersection lines.

The design principle of the geometric transformation of the CTE inhomogeneity distribution in round form by lateral deformation is also suited for adaptation to CA areas with a rather complex outline. It is important that the distribution profile produced thereby can be described by way of simultaneous or sequential stretching of the distribution profile of the round form (or of parts thereof) in several spatial directions. These spatial directions preferably extend in a common deformation plane which, in turn, preferably extends perpendicular to the plane of the optically used area CA.

The demand made on the similarity of the length-normalized sections in the non-rotation symmetrical dCTE distribution profile according to the invention has to be satisfied over the total oval, optically exposed area CA. Difficulties arise here often on the edge of CA. Two preferred embodiments of the blank according to the invention shall be described hereinafter; these refine the above-explained general design principle especially for the edge region of CA under the aspect of the interaction of CA and dCTE distribution profile.

First Embodiment

The non-rotation symmetrical dCTE distribution profile according to an embodiment of the present invention is distinguished in that it has a non-rotation symmetrical shape within which the closed isolines extend around a surface normal of the CA plane and represent the same level of the CTE inhomogeneity, comparable to height lines around a mountain top.

Based on this basic condition, it is provided in a first preferred embodiment that the dCTE distribution profile has a closed isoline with a dCTE value of $0.5 \times dCTE_{max}$, of which a sub-length of at least 80% of the total length of the isoline extends within the optically used area CA.

The isoline of the dCTE distribution profile that represents a dCTE value with half the level of the maximum dCTE inhomogeneity extends at least over 80% of its total length, preferably completely, within the CA of the mirror substrate blank. With a complex course of the dCTE distribution profile (e.g. with a profile having a wave shape), several closed isolines may also extend at that level; these have different distances from the centroid of the area of CA. In this case it is normally helpful when the isoline extending closest to the CA outline satisfies the above-mentioned condition, i.e. extends over 80% or more of its length on or within the outline of CA. Ideally, this is also the isoline with the greatest distance from the centroid of the area of CA. In other cases where it cannot be determined in a definite manner which isoline with the level $0.5 \times dCTE_{max}$ extends closer to CA or where such an isoline is missing, this criterion for adjusting and assessing the adaptation quality of the dCTE distribution profile to CA is not applicable.

This means that the shape of the dCTE inhomogeneity profile of the outline line of CA is adapted such that the majority of the equidistant isolines extend within CA (at least with 80% of the respective isoline length). Ideally, the shape of the dCTE inhomogeneity profile of the outline of CA is exactly adapted, so that all isolines extend on or within the outline of CA.

Second Embodiment

In a second preferred embodiment of the blank according to the present invention, it is provided that the non-circular area of CA is defined by a non-circular outline along which a dCTE maximum value and a dCTE minimum value of the dCTE distribution profile are positioned, wherein the difference—$PV_{CA}$—between maximum value and minimum value is not more than $0.5 \times dCTE_{max}$.

While the first embodiment focuses on a substantial alignment of the geometric shapes of non-circular oval CA outline and non-rotation symmetrical dCTE distribution profile, the second embodiment concentrates on a quantification of the interaction between the dCTE distribution profile and the optically used area.

The dCTE distribution profile is here configured such that the CA outline is intersected by a number of isolines of the distribution profile that is as small as possible. The reason is that the more the CA outline is intersected by isolines, the more pronounced will be the optical impact of the dCTE distribution on the imaging quality within CA.

A measure of this impact is given by summing up the absolute values of the level differences in the dCTE values along the CA outline. The greater the total level difference obtained by summing up, the stronger is the influence of the dCTE distribution profile on optical imaging within CA. The total level difference, however, may depend on the circumferential length of the CA outline. Therefore, the difference $PV_{CA}$ which is obtained as the difference following from the dCTE extreme values (maximum value and minimum value) which arise along the CA outline is used according to the present invention as a measure of the degree of interaction by intersecting the CA outline by isolines of the dCTE distribution profile. $PV_{CA}$ is not more than half the maximum dCTE inhomogeneity over CA on the whole, preferably not more than $0.3 \times dCTE_{max}$.

It has turned out to be advantageous when the distribution profile can be mathematically described in a biunique manner by stretching a rotation-symmetrical distribution profile in at least one spatial direction, wherein the stretching factor is at least 1.2.

The stretching factor stands here for the length ratio after and before stretching. The greater its deviation from 1, the more noticeable will be the advantage of the distribution profile during use of the blank according to the present invention.

In this respect it has also turned out to be advantageous when the distribution profile can be mathematically described in a biunique manner by stretching the round form in plural spatial directions, with the spatial directions extending in a common deformation plane extending in parallel with the optically used area CA.

In an advantageous embodiment of the blank according to the invention the dCTE distribution profile can be described by stretching the circular form in three directions extending in the same deformation plane and enclosing an angle of 120°.

Starting from the center of a rotation axis-symmetrical distribution, one obtains by triple simultaneous stretching a dCTE distribution profile that has e.g. the cross-sectional shape of a three-sided cloverleaf, a Wankel engine piston or a plectrum.

As for the manufacturing method, the above-mentioned technical objective is achieved according to the present invention by a method comprising the following steps:
a) providing a glass cylinder of Ti-doped silica glass with rotation-symmetrical dCTE distribution profile, and
b) shaping the glass cylinder by softening the cylinder and forming the same under the action of a shaping force having a force component acting in a direction perpendicular to the longitudinal axis of the glass cylinder, thereby stretching the rotation-symmetrical profile in at least one direction so as to obtain a cylindrical blank which has a non-circular cross-section and a non-rotation symmetrical dCTE distribution profile.

The starting point of the method according to the present invention is a glass cylinder with a dCTE distribution profile which ideally extends exactly in rotation symmetry with respect to the cylinder axis. In practice, a two-dimensional dCTE distribution profile that meets the demands as explained in DE 10 2004 024 808 A1 and mathematically described by way of the above formula (1) is e.g. adequate. Such a profile is here defined to be rotation-symmetrical although it does not fully exhibit this geometry.

For the adaptation of such a glass cylinder for use with optical exposure with CA differing from the circular shape, the glass cylinder is subjected to a shaping process and deformed, i.e. stretched, in this process laterally relative to the longitudinal axis of the glass cylinder by way of the above-explained "geometric transformation". The result of the shaping process is a cylindrical blank of Ti-doped silica glass with a non-circular cross-section. A simple stretching operation is already enough for transforming the preset rotation-symmetrical profile into a non-rotation symmetrical distribution profile of the CTE inhomogeneity, which also without any further adaptation measure is better suited for optical exposure with elongated oval CA than without the shaping process.

While the glass cylinder is being shaped according to method step (b), the cylinder is stretched once or repeatedly in a direction extending perpendicular to the longitudinal axis of the glass cylinder. In the case of repeated shaping, the deformation measures can be taken at the same time or successively. In the last-mentioned case, the glass body obtained after a shaping step is further deformed in a subsequent shaping step.

Here, the longitudinal axis of the glass cylinder conforms to the optical axis or the main functional direction of the mirror substrate blank to be produced. It is thereby ensured that the rotation-symmetrical dCTE distribution profile in the glass cylinder is reflected in a geometrically similar form in the shaped blank. Ideally, shaping forces are only operative in a direction perpendicular to the longitudinal axis of the glass cylinder; in practice, however, shaping forces with other directional components can hardly be avoided. A decisive factor for the quality and usability of the blank obtained is that the "similarity" with the rotation-symmetrical dCTE distribution profile is maintained. This goal is achieved when the essential features of the original rotation-symmetrical distribution are found again in the distribution obtained by shaping. The essential features in this sense are the number of the relative and absolute extreme values of the original distribution and their mutual relative position.

The dCTE distribution profile set thereby is not rotation-symmetrical in relation to the longitudinal axis of the former glass cylinder and is distinguished in that:

1) any straight profile sections normalized to length and passing through the centroid of the CA area yield a dCTE family of curves forming a curve band with a maximum bandwidth of less than $0.5 \times dCTE_{max}$, preferably of less than $0.3 \times dCTE_{max}$,
2) and preferably that isolines closed around the longitudinal axis with a level of the CTE inhomogeneity of $0.5 \times dCTE_{max}$ extend completely or at least over 80% of their length within CA,
3) and/or preferably that along the outline of CA the difference—$PV_{CA}$—between maximum value and minimum value is not more than $0.5 \times dCTE_{max}$, as has been explained in more detail above with reference to the blank according to embodiments of the present invention.

The molded body obtained thereby, which consists of $TiO_2$—$SiO_2$ glass, can be directly used as a mirror substrate blank either after thermal further treatment, e.g. by annealing, and/or mechanical further processing, such as grinding and polishing, or it serves as a pre-product for further processing in order to obtain the blank.

The shaping process can be carried out in that the glass cylinder is heated with a flame and softened and is deformed in this process by means of shaping forces acting on the outer cylinder surface. Particularly with respect to an especially reproducible and defined adjustment of the CTE distribution profile, a procedure is however preferred in which the shaping according to method step (b) comprises a shaping step in which the glass cylinder with vertically oriented longitudinal axis of the glass cylinder is arranged in a melt mold with non-rotation symmetrical inner geometry and is heated therein to a temperature of at least 1,200° C. and is softened thereby such that is flows out laterally into the melt mold under the action of gravity, preferably supported by a pressing force.

As a result of the shaping step, the geometry of the glass cylinder is adapted to the geometry of the CA as specified—that means: the glass cylinder has a non-rotation symmetrical cross section (in a plane perpendicular to the cylinder axis) which is adapted to the geometry of the specified CA, but not—as usual—a cross section which is adapted to a geometry of the final mirror substrate.

It is enough for the generation of a dCTE distribution profile with an oval-elliptical cross-section to use a melt mold having an inner geometry which, viewed in cross section in a direction perpendicular to the longitudinal axis of the glass cylinder, has a long axis and a shorter axis in comparison therewith.

In a preferred procedure, a dCTE distribution profile with an oval-elliptical cross-section is e.g. achieved in that a melt mold is used with an inner geometry which is oval in cross section or with an inner rectangular geometry.

Procedures that yield a cylindrical glass body are considered for the production of the Ti-doped silica glass. The so-called VAD (vapor axial deposition) method should here specifically be mentioned; in this method, $SiO_2$ particles are deposited on the front side of a rotating substrate and are directly vitrified into the cylindrical glass body. A method variant has also turned out to be particularly useful, in which providing the glass cylinder according to method step (a) comprises:

aa) producing a porous soot body of $SiO_2$ and $TiO_2$ by flame hydrolysis of start substances containing silicon and titanium,
bb) drying and sintering the soot body to form an elongated glass pre-product of Ti-doped silica glass,
cc) homogenizing the glass pre-product in a homogenization process in which the pre-product is heated to a temperature of more than 1,500° C., is softened therein and shaped into the glass cylinder.

The Ti-doped silica glass is here synthetized according to the so-called "soot method". A porous soot body is obtained as the intermediate product, the soot body having a chemical composition that can be changed by doping or by drying.

Drying for adjusting a predetermined hydroxyl group content of the $TiO_2$—$SiO_2$ glass is carried out by reactive chemical treatment by means of halogens or by thermal treatment of the soot body under vacuum.

The $TiO_2$—$SiO_2$ glass is heated by vitrification and subsequent homogenization to a temperature that is so high that possible rutile microcrystals are melting. The glass is simultaneously deformed, e.g. by twisting, to effect a more homogeneous distribution of the $TiO_2$ concentration. For this purpose the $TiO_2$—$SiO_2$ glass is subjected to a homogenization process in which it is heated to a temperature of more than 1,500° C. and softened and shaped in this process. After completion of the homogenizing process, the $TiO_2$—$SiO_2$ glass is present in the form of the glass cylinder with rotation-symmetrical dCTE distribution profile.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

First Embodiment of a Method for Producing a Cylindrical Pre-Product for a Mirror Substrate Blank A soot body doped with about 8% by wt. of $TiO_2$ is produced preferably with the help of the OVD method by flame hydrolysis of octamethylcyclotetrasiloxane (OMCTS) and titanium isopropoxide [$Ti(O^iPr)_4$] as starting substances for the formation of $SiO_2$—$TiO_2$ particles.

The soot body is dehydrated at a temperature of 1150° C. in a heating furnace with a heating element of graphite under vacuum. The dehydration treatment preferably ends after 2 hours.

The soot body dried in this way is subsequently vitrified in a sintering furnace at a temperature of about 1500° C. under reduced pressure ($10^{-2}$ mbar) into a transparent blank consisting of $TiO_2$—$SiO_2$ glass. The mean OH content of the glass is about 170 wt. ppm.

The glass is then homogenized by thermo-mechanical homogenization (twisting) and formation of a cylinder of $TiO_2$—$SiO_2$ glass. To this end, a rod-like start body is clamped into a glass lathe equipped with an oxyhydrogen burner and is homogenized on the basis of a shaping process, as described in EP 673 888 A1, for the complete removal of layers. In this process, the starting body is heated by means of the oxyhydrogen burner locally to more than 2,000° C. and thereby softened. In this process, the oxyhydrogen burner is fed with 1.8 mole hydrogen per 1 mole oxygen, and an oxyhydrogen flame with an oxidizing effect is thereby produced.

The starting body is twisted about its longitudinal axis by relative movement of the two holders relative to each other, the softened glass mass being thoroughly mixed under formation of a twist body in radial direction over the whole length of the starting body. An elongated twisted body with a diameter of about 90 mm and a length of about 960 mm is thereby obtained.

Figure 1:
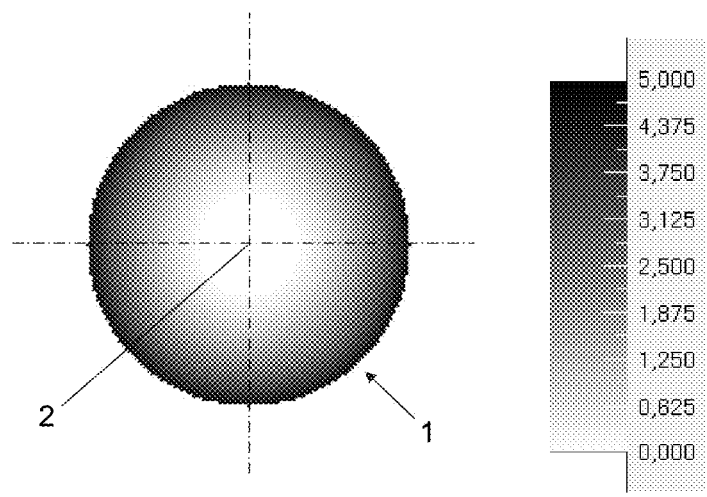
FIG. 1 shows a dCTE distribution profile of a $SiO_2$—$TiO_2$ blank with a round cross-section in a false-color representation (in gray values) together with a gray value scale (in ppb/K)

A round starting plate of $TiO_2$—$SiO_2$ glass with a diameter of 200 mm and a thickness of 195 mm is formed from the twisted body. FIG. 1 shows a false-color representation (shades of gray) of the dCTE distribution profile measured over the thickness of the starting plate 1, in a top view on the top side of the plate. According to the gray scale shown at the right side of FIG. 1 the relative dCTE values are between zero and 5 ppb/K. This gray scale is also the basis for the false-color representation (shades of gray) of FIGS. 3, 4, 8, 9, 13, 14, 18 and 19.

The distribution profile is substantially rotation-symmetrical with respect to the center axis 2 of the plate, with the dCTE values decreasing from the outside to the inside. The relative zero value (the minimum CTE value of the profile) is located on the center axis 2.

Figure 2:
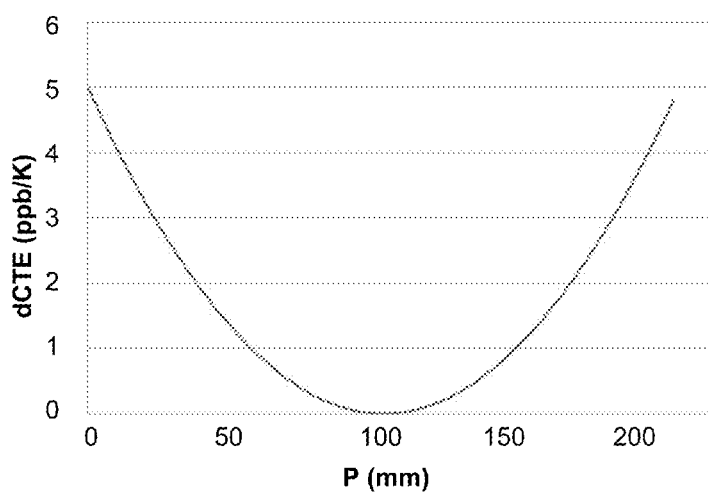
FIG. 2 shows the dCTE distribution profile of FIG. 1 in a section through the center in a diagram representation.

This is also demonstrated in the diagram of FIG. 2, in which the dCTE distribution profile of the starting plate 1 is shown in a section through the center axis 2. The dCTE value is here plotted in ppb/K against the position P (diameter) in mm. Hence, dCTE is evenly decreasing inwardly from a value of about 5 ppb/K to zero. The total homogeneity $dCTE_{max}$ as the difference between the maximum inhomogeneity value on the edge and the minimum inhomogeneity value (zero) in the center is thus 5 ppb/K.

The maximum difference of the CTE values is relatively small at 5 ppb/K. The differences are primarily due to variations of the $TiO_2$ concentration and to fluctuations of the fictive temperature. At this relatively low dCTE level, slight variations in the manufacturing process, e.g. in the deposition or homogenization step, may lead to fundamentally different dCTE distribution profiles. In particular, a distribution profile which is horizontally mirrored in comparison with FIG. 1 is often obtained with a CTE maximum value in the region of the center axis and the dCTE zero value on the edge.

It is, however, important for the present invention that the dCTE distribution profile of the respective starting plate is substantially rotation-symmetrical. This is ensured in the embodiment by the homogenization process.

Such round starting plates are the starting point for the manufacture of different molded bodies, as shall be explained hereinafter with reference to examples.

Example 1

Manufacture of the Mirror Substrate Blank from the Pre-Product

Figure 4:
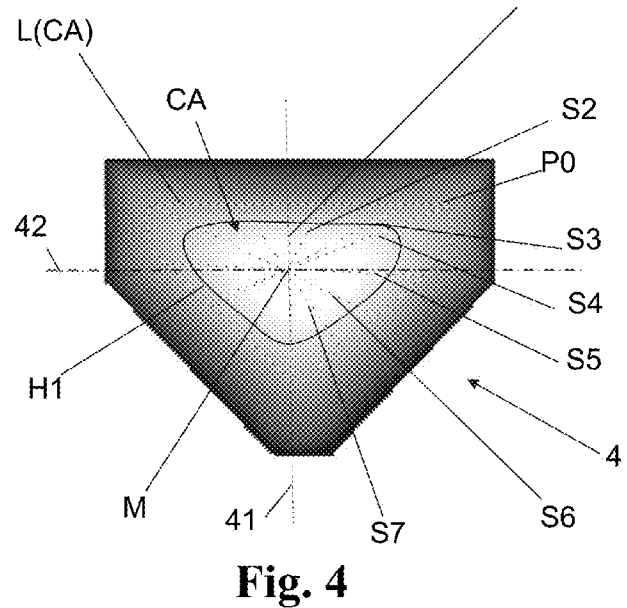
FIG. 4 shows a dCTE distribution profile according to an embodiment of the present invention which has been produced by lateral deformation, with plotted CA with pentagonal form, isolines and distribution-profile intersection lines S1 to S7.

The starting plate 1 of $TiO_2$—$SiO_2$ glass with a diameter of 200 mm and a thickness of 195 mm is shaped in a furnace by lateral shaping into a polygonal plate 4 with five corners, as is schematically shown in FIG. 4. To this end, the starting plate 1 is centrally inserted into a melt mold of graphite which has a pentagonal inner cross-section, similarly as explained further below in more detail for a shaping into a plate having a triangular cross-section. The melt mold is evacuated and heated to 1350° C. and subsequently with a ramp of 9° C./min to 1700° C., and thereafter with a ramp of 2° C./min to a temperature of 1780° C. At this temperature, the quartz glass mass softens and the softened quartz glass deforms under its own weight and the weight of a graphite plate additionally placed thereon for the purpose of acceleration and flows out in lateral direction, thereby filling the bottom of the melt mold completely.

The pentagonal plate 4 (FIG. 4) obtained thereby consists of homogenized glass having a high silicic-acid content that contains 8% by wt. of titanium oxide and has a mean hydroxyl group content of around 170 wt. ppm. FIG. 4 shows a false-color representation of the dCTE distribution profile (as shade of gray with the gray scale of FIG. 1), measured over the plate thickness of the pentagonal plate 4 in a top view on the top side thereof. The dCTE distribution profile is now no longer rotation-symmetrical as in the starting plate 1, but substantially polygonal with mirror symmetry with respect to the center axis 41. Based on the total cross-section of the pentagonal plate, the dCTE extreme values with 5 ppb/k and 0 ppb/K are the same as in the starting plate 1.

Figure 3:
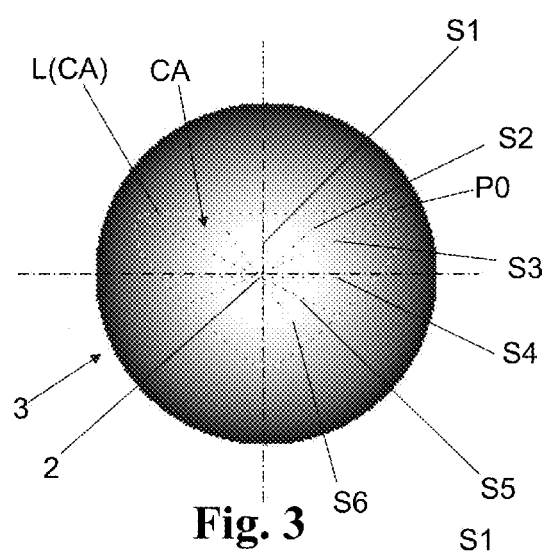
FIG. 3 shows the dCTE distribution profile of FIG. 1 with plotted hypothetical CA with pentagonal form and six distribution-profile intersection lines S1 to S6.

By comparison, FIG. 3 shows a hypothetical dCTE distribution profile of a round plate 3 which can be produced from the starting plate 1 by way of outflowing. This is not the subject of the present invention, but just serves comparative purposes. The starting plate 1 is here shaped by way of outflowing into a melt mold with a round cross-section. The starting plate 1 is here centrally mounted within the melt mold with vertically oriented longitudinal axis. The softened quartz glass flows out in lateral direction, thereby filling the bottom of the melt mold completely. The round plate 3 formed in this way has a diameter of 280 mm and a thickness of 100 mm.

During the hypothetical deformation into the round plate 3, the viscous quartz-glass mass of the starting plate 1 moves in the direction of the surrounding melt mold edge and reaches the same theoretically at all points at the same time. The dCTE distribution profile of the round plate 3 is thus identical—in all sections through the center 2—with the profile shown in FIG. 2.

By contrast, the softened quartz-glass mass upon deformation of the starting plate 1 into the pentagonal plate 4 hits against an obstacle in at least one direction relatively early and accumulates on the obstacle, whereas otherwise it can still freely flow out in other directions. In these directions the dCTE distribution profile is thus more strongly stretched in comparison with the other direction. Therefore, the dCTE distribution profile of the pentagonal plate 4 is also almost identical with the profile shown in FIG. 2 in a section through the center axis M of the plate along the relatively short mirror axis 41, but it is more strongly stretched in the relatively long section through the center axis M of the plate along the axis 42 extending perpendicular thereto.

Irrespective of this, there is "similarity" between the dCTE distribution profiles of the original starting plate 1, the round plate 3 and the pentagonal plate 4, in the sense that the essential features of the dCTE distribution profile in the pentagonal form, namely the number of the relative and absolute extreme values of the distribution and also their relative position to one another, are the same as in the starting plate 1 and in the round plate 3. In this respect the dCTE distribution profile of FIG. 4 already fulfills part of the above-explained basic conditions that form the basis for the design principle for a mirror substrate blank according to this invention. It is not rotation-symmetrical, but by way of "geometric transformation" and in consideration of simple stretching deformations it can be transformed mathematically uniquely into the originally rotation-symmetrical distribution of the round form of the starting plate 1.

Moreover, by comparison with the original, rotation-symmetrical distribution profile, the dCTE distribution profile of FIG. 4 shows an interaction with a comparatively insignificant impairment of the imaging quality of the mirror in cooperation with a non-circular, optically used area CA. This shall be explained in more detail hereinafter:

(a) Bandwidth of Intersection Lines

As a supplement to FIG. 1, the outline L(CA) of an optically used area CA with pentagonal form and rounded edges is plotted in FIG. 3. Within CA a plurality of intersection lines S1 to S6 extending through the center 2 are plotted. The center 2 is the centroid of the area of CA at the same time.

When dCTE values are mentioned hereinafter, these refer to the region within CA. The dCTE values are thus calculated as the amount of the local deviation from an absolute minimum value $CTE_{min}$ of the CTE distribution profile within CA (dCTE=CTE−$CTE_{min}$).

Figure 5:
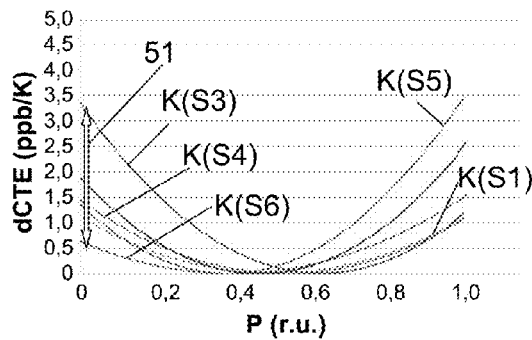
FIG. 5 is a diagram which shows the dCTE evolution of the profile of FIG. 3 along the normalized intersection lines S1 to S6.

The diagram of FIG. 5 shows the dCTE distribution profiles along the intersection lines S1 to S6 (within CA; only the most prominent intersection lines of relevance to the assessment are provided with reference numerals). On the ordinate of the diagram, the relevant dCTE value is plotted (in ppb/K) and, on the abscissa, a position value P normalized to the respective intersection line length (in relative unit), which thereby covers the range of 0 to 1. The maximum inhomogeneity $dCTE_{max}$ within CA is thus about 3.4 ppb/K. The minimum value $dCTE_{min}$ within CA is zero by definition. Distinctly different dCTE values are found in the region of the edge positions 0 and 1 between the section profiles K(S3) and K(S5) on the one hand and the section profiles K(S1) and K(S6) on the other hand. In the maximum (marked with block arrow 51) the difference is about 2.8 ppb/K. The maximum 51 represents the maximum bandwidth of the family of curves formed by the curves K(S1) to K(S6); it is about 82% of $dCTE_{max}$ (3.4 ppb/K).

Figure 6:
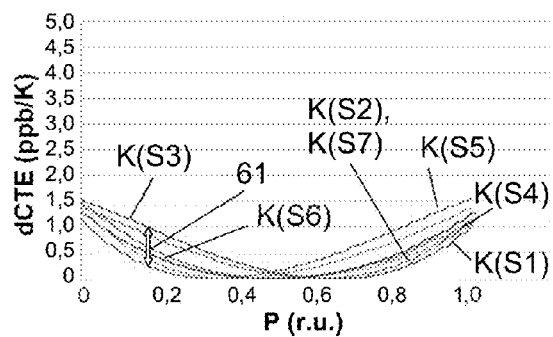
FIG. 6 is a diagram which shows the dCTE evolution of FIG. 4 along the normalized intersection lines S1 to S7.

The same outline L(CA) of the optically used area CA with pentagonal form and rounded-off edges is schematically plotted also in the distribution profile of FIG. 4. The centroid of the area of CA is in point M. The diagram of FIG. 6 shows the dCTE distribution profiles along some prominent intersection lines S1 to S6 (within CA) in the case of the dCTE distribution profile of FIG. 4. In this case, too, the corresponding dCTE value is plotted (in ppb/K) on the ordinate of the diagram, and the position value normalized to the respective intersection line length on the abscissa. It is evident from this that all section profiles K(S1) to K(S6) are relatively similar and form a small curve band. The maximum inhomogeneity $dCTE_{max}$ within CA is thus about 1.6 ppb/K. The maximum difference of the dCTE values (marked with block arrow 61) is only about 0.75 ppb/K. Consequently, the maximum bandwidth of the family of curves formed by the curves K(S1) to K(S6) (maximum 61) is here about 47% of $dCTE_{max}$. Moreover, it has been possible through the use of the same start material to reduce $dCTE_{max}$ within the CA area from 3.4 ppb/K (see FIGS. 3 and 5) to 1.6 ppb/K (see FIGS. 4 and 6), which is accompanied by an improved imaging quality in the application as a mirror for EUV lithography.

(b) Height Difference on the CA Outline L(CA)

Figure 7:
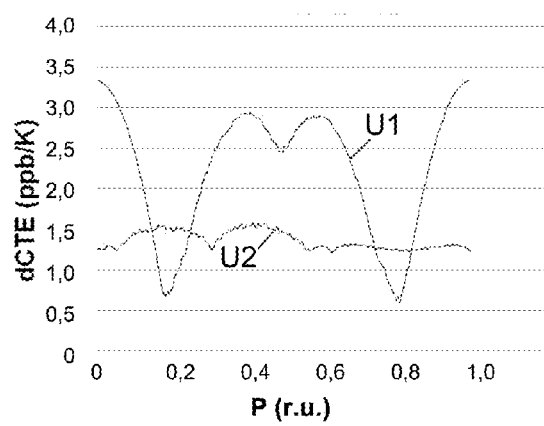
FIG. 7 is a diagram with two curves that show the dCTE evolution along the CA outline in the distribution profile of FIG. 3 and the dCTE evolution, respectively, along the CA outline in the distribution profile of FIG. 4.

The diagram of FIG. 7 shows a comparison of the evolutions of the dCTE distribution profile along the CA outlines L(CA) in the blanks of FIGS. 3 and 4, each starting with a clockwise circulation and ending at position P0 (position P0 marked in FIGS. 3 and 4). On the y-axis, the dCTE value is plotted in ppb/K against the position P normalized to the respective length of the outline L(CA) (in relative unit) (the lengths of the outlines L(CA) are identical in this case).

Curve U1 represents the evolution of the dCTE distribution profile along the CA outline L(CA) in the blank of FIG. 3. This yields a difference $PV_{CA}$ between the dCTE extreme values (maximum value (3.4 ppb/K) and minimum value (0.7 ppb/K) of 2.7 ppb/K along the CA outline L(CA). $PV_{CA}$ is thus about $0.79 \times dCTE_{max}$. Curve U2 represents the evolution of the dCTE distribution profile along the CA outline L(CA) in the blank of FIG. 4. This yields a difference $PV_{CA}$ between the dCTE extreme values (maximum value (1.6 ppb/K) and minimum value (1.2 ppb/K) of 0.4 ppb/K along the CA outline L(CA). $PV_{CA}$ is thus about $0.25 \times dCTE_{max}$.

By comparison with the dCTE distribution profile of FIG. 3, the mirror substrate blank 4 shows a better imaging behavior upon optical exposure with the non-circular CA. This may be due to the fact that the dCTE distribution profile is well fitted to the shape of CA and designed such that the CA outline L(CA) is intersected by a number of isolines of the distribution profile that is as small as possible.

(c) Extension of the Isoline with the Level $0.5 \times dCTE_{max}$

An isoline H1 for the dCTE value of $0.5 \times dCTE_{max}$ is schematically plotted in FIG. 4. It is discernible that the isoline H1 extends with its whole isoline length within the outline L(CA) of the optically used area CA. This means that the shape of the dCTE inhomogeneity profile in the mirror substrate blank 4 of FIG. 4 is matched to the outline L(CA) to the extent that the CA outline L(CA) is intersected by a number of isolines of the distribution profile that is as small as possible.

Thus blank 4 in combination with its specific, optically used area CA in pentagonal form meets all conditions of the general design principle according to the invention, namely the demand made on the dCTE distribution profile of the blank and the interaction between the dCTE distribution profile and the optically exposed area CA with non-circular outline L(CA).

Example 2

Figure 9:
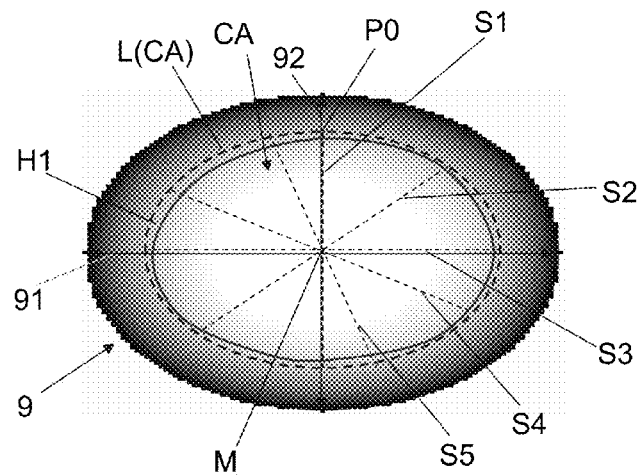
FIG. 9 shows a dCTE distribution profile according to an embodiment of the present invention which has been produced by lateral deformation, with plotted CA with elliptical shape, isolines and distribution-profile intersection lines.

In a further example of the invention, the starting plate 1 of $TiO_2$—$SiO_2$ glass with a diameter of 200 mm and a thickness of 195 mm is shaped in a furnace by lateral shaping into a plate 9 with oval cross-section, as is schematically shown in FIG. 9. To this end the starting plate 1 is centrally inserted into a melt mold of graphite which has an oval inner cross-section. Otherwise, the lateral deformation by softening and outflowing into the melt mold is carried out in the way as has already been explained with reference to Example 1. In comparison with the starting plate 1 of FIG. 1, the ratio of the long oval half-axis 91 to the short axis 92 is about 1.45.

The oval plate 9 obtained thereby consists of homogenized glass having a high-silicic acid content, which contains 8% by wt. of titanium oxide and has a mean hydroxyl group content of around 170 wt. ppm.

The false-color representation of FIG. 9 (as shade of gray with the gray scale of FIG. 1) almost shows mirror symmetry with respect to the main axes 91 and 92 of the oval. The dCTE extreme values (5 ppb/K) and (0 ppb/K) within the whole area of the blank 9 are the same as in the starting plate 1. There is "similarity" between the dCTE distribution profiles of the starting plate 1 and the plate 9 with oval cross-section in the sense that the essential features of the dCTE distribution profile in the oval form, namely the number of the relative and absolute extreme values of the distribution and also their relative mutual position, are the same with respect to one another. In this respect, the dCTE distribution profile of FIG. 9 already fulfills part of the above-explained basic conditions that form the basis for the design principle for a mirror substrate blank according to this invention. It is not rotation-symmetrical, but by way of "geometric transformation" and in consideration of simple stretching deformations it can be transformed mathematically uniquely into the originally rotation-symmetrical distribution.

Moreover, by comparison with a rotation-symmetrical distribution profile, the dCTE distribution profile of FIG. 9 shows an interaction with a comparatively insignificant impairment of the imaging quality of the mirror in cooperation with a non-circular, optically used area CA. This shall be explained in more detail hereinafter:

(a) Bandwidth of Intersection Lines

Figure 8:
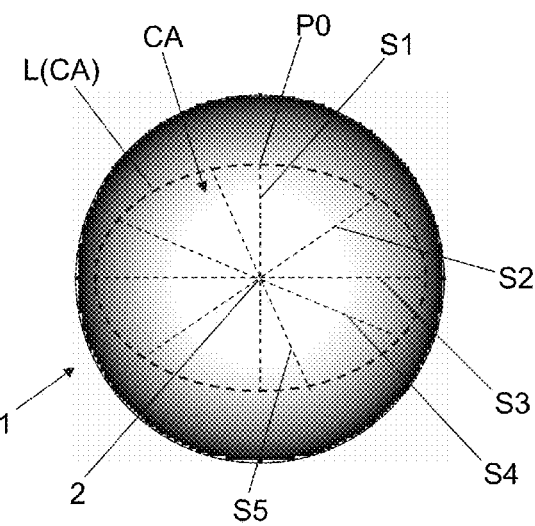
FIG. 8 shows the dCTE distribution profile of FIG. 3 with plotted hypothetical CA with elliptical shape and distribution-profile intersection lines.

By comparison, FIG. 8 shows the round plate 3 again (as explained with respect to FIG. 3). The outline L(CA) of an optically used area CA is schematically plotted therein, which outline could be called "ellipsoidal". Within CA, a plurality of intersection lines S1 to S5 that extend through the center 2 are plotted. The center 2 simultaneously forms the centroid of the area of CA.

Figure 10:
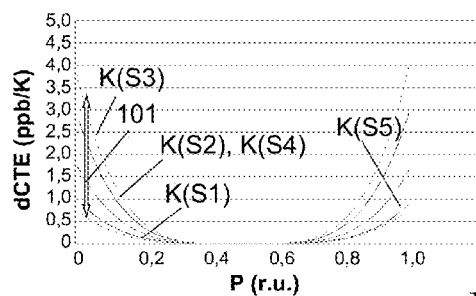
FIG. 10 is a diagram which shows the dCTE evolution of the profile of FIG. 8 along the normalized intersection lines.

The diagram of FIG. 10 shows the dCTE distribution profiles along the intersection lines S1 to S5 (within CA; only the most prominent lines that are of importance to the determination of the width of the family of curves are provided with reference numerals). On the ordinate of the diagram, the relevant dCTE value is plotted (in ppb/K) and, on the abscissa, a position value P normalized to the respective intersection line length (in relative unit), which thereby covers the range of 0 to 1. Distinctly different dCTE values in the region of the edge positions 0 and 1 are found between the section profiles K(S1) to K(S5). In the bandwidth maximum (marked with block arrow 101), the difference between minimum value and maximum value is about 3.1 ppb/K. The maximum 101 represents the maximal bandwidth of the family of curves formed by the curves K(S1) to K(S5); it is about 79% of $dCTE_{max}$.

Figure 11:
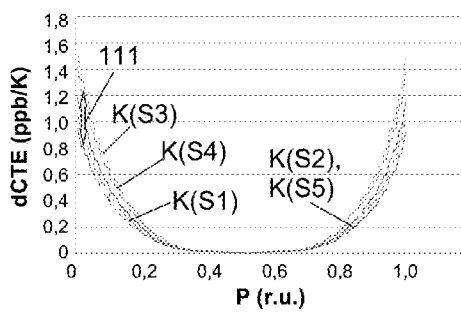
FIG. 11 is a diagram which shows the dCTE evolution of FIG. 9 along the normalized intersection lines.

The same outline L(CA) of the optically used area CA with elliptical form is schematically plotted also in the distribution profile of FIG. 9. The centroid of the area of CA lies in point M. The diagram of FIG. 11 shows the dCTE distribution profiles along intersection lines S1 to S5 (within CA) in the case of the dCTE distribution profile of FIG. 9. In this case, too, the corresponding dCTE value is plotted (in ppb/K) on the ordinate of the diagram, and the position value P normalized to the respective intersection line length (in relative units) on the abscissa. It is evident from this that all section profiles K(S1) to K(S6) are relatively similar and form a small curve band. The maximum difference of the dCTE values (marked with block arrow 111) is only about 0.6 ppb/K. The maximum inhomogeneity $dCTE_{max}$ within CA is thus about 1.55 ppb/K. Consequently, the maximum bandwidth of the family of curves formed by the curves K(S1) to K(S5) (maximum 111) is here about 39% of $dCTE_{max}$.

(b) Height Difference on the CA Outline L(CA)

Figure 12:
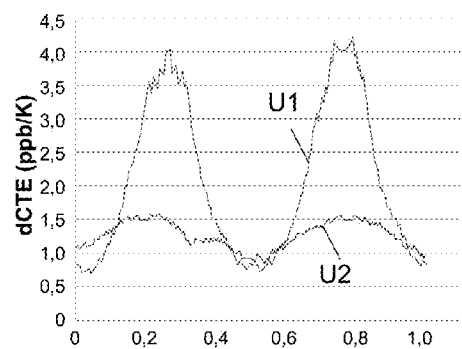
FIG. 12 is a diagram with two curves that show the dCTE evolution along the CA outline in the distribution profile of FIG. 8 and the dCTE evolution, respectively, along the CA outline in the distribution profile of FIG. 9.

The diagram of FIG. 12 shows a comparison of the evolutions of the dCTE distribution profile along the CA outlines L(CA) in the blanks of FIGS. 8 and 9, each starting with a clockwise circulation and ending at position P0. On the y-axis, the dCTE value is plotted (in ppb/K) against the position P normalized to the respective length of the outline L(CA) (the lengths of the outlines L(CA) are here also identical).

Curve U1 represents the evolution of the dCTE distribution profile along the CA outline L(CA) in the blank of FIG. 8. This yields a difference $PV_{CA}$ between the dCTE extreme values (maximum value (4 ppb/K) and minimum value (0.8 ppb/K) of 3.2 ppb/K along the CA outline L(CA). $PV_{CA}$ is thus about $0.80 \times dCTE_{max}$.

Curve U2 represents the evolution of the dCTE distribution profile along the CA outline L(CA) in the blank of FIG. 9. This yields a difference $PV_{CA}$ between the dCTE extreme values (maximum value (1.5 ppb/K) and minimum value (1 ppb/K) of 0.5 ppb/K along the CA outline L(CA). $PV_{CA}$ is thus about $0.33 \times dCTE_{max}$.

(c) Extension of the Isoline with the Level $0.5 \times dCTE_{max}$

An isoline H1 for the dCTE value of $0.5 \times dCTE_{max}$ is schematically plotted in FIG. 9. It is discernible that the isoline H1 extends with almost its whole isoline length (with more than 80% of its length) within the outline L(CA) of the optically used area CA. This means that the shape of the dCTE inhomogeneity profile in the mirror substrate blank 9 of FIG. 9 is matched to the outline L(CA) to the extent that the CA outline L(CA) is intersected by a number of isolines of the distribution profile that is as small as possible.

Thus, blank 9 in combination with its specific, optically used area CA also satisfies all conditions of the general design principle according to the invention, namely the demand made on the dCTE distribution profile of the blank and the interaction between the dCTE distribution profile and the optically exposed area CA with non-circular outline L(CA).

Second Embodiment of Method for Producing a Cylindrical Pre-Product for a Mirror Substrate Blank A soot body which is doped with about 8% by wt. of $TiO_2$ is produced with the help of the OVD method by flame hydrolysis of octamethylcyclotetrasiloxane (OMCTS) and titanium isopropoxide [$Ti(O^iPr)_4$] as start substances for the formation of $SiO_2$—$TiO_2$ particles. By comparison with the above-explained first procedure, the surface temperature of the soot body is kept slightly higher during the whole deposition process. This small difference leads to a different distribution of the $TiO_2$ concentration.

Example 3

The starting plate of $TiO_2$—$SiO_2$ glass with a diameter of 200 mm and a thickness of 195 mm is shaped in a furnace by lateral shaping into a rectangular plate with the lateral dimensions 400 mm×250 mm and a thickness of 60 mm. To this end the starting plate is centrally inserted into a melt mold of graphite which has a rectangular inner cross-section with a short side b=250 mm and a long side a=400 mm. Otherwise, the lateral deformation by softening and outflowing into the melt mold is carried out as has already been explained with reference to Example 1.

The rectangular plate 14 obtained thereby consists of homogenized glass having a high-silicic acid content, which contains 8% by wt. of titanium oxide and has a mean hydroxyl group content of around 170 wt. ppm.

Figure 13:
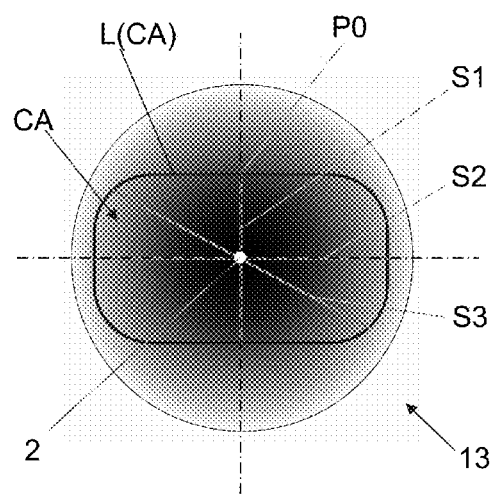
FIG. 13 shows a second dCTE distribution profile with plotted hypothetical CA with rectangular shape and three distribution-profile intersection lines S1, S2, S3.
Figure 14:
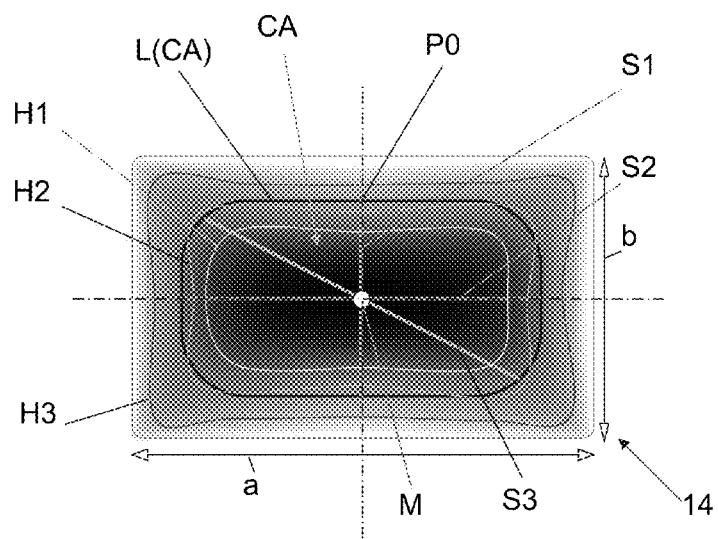
FIG. 14 shows a dCTE distribution profile according to an embodiment of the present invention which has been produced by lateral deformation of a round initial plate, with plotted CA with rectangular shape, isolines and three distribution-profile intersection lines S1, S2, S3.

The false-color representation of FIG. 14 (as shade of gray with the gray scale of FIG. 1) shows the dCTE distribution profile measured over the plate thickness of the rectangular plate 14 with the plate sides a and b in a top view on the top side thereof. The dCTE distribution profile is now no longer rotation-symmetrical as in the round plate 13 made of the same starting plate, as is schematically shown for comparison in FIG. 13, but it has an approximately 2-axis symmetry with the two main axes a and b of the rectangular plate 14 as the mirror axes. In this profile the dCTE values are increasing from the outside to the inside up to the center axis M. The relative extreme value $dCTE_{max}$, viewed over the whole blank, is 5 ppb/K.

The deformation of the starting plate in relation to the rectangular plate 14 differs from the deformation in relation to the round plate 13 (as shown in FIG. 13; the dCTE distribution profile thereof corresponds to that of the starting plate) in that in the direction of the long plate side a stronger stretching (stretching factor in relation to the starting plate=2) has taken place than in the direction of the short plate side b (stretching factor=1.25). Therefore, the dCTE distribution profile in a section through the center axis M of the plate along the long plate side "a" in comparison with the profile of the round plate 13 of FIG. 13 is stretched, and in the direction of the short plate side "b" it is almost identical with the profile shown in FIG. 13.

"Similarity" exists between the dCTE distribution profiles of the original starting plate and the rectangular plate 14 in the sense that the essential features of the dCTE distribution profile in the rectangular form, namely the number of the relative and absolute extreme values of the distribution and also the mutual relative position thereof are the same as in the starting plate. In this respect, the dCTE distribution profile of FIG. 14 already fulfills part of the above-explained basic conditions that form the basis for the design principle for a mirror substrate blank according to this invention. It is not rotation-symmetrical, but by way of "geometric transformation" and in consideration of simple stretching deformations it can be transformed mathematically uniquely into the originally rotation-symmetrical distribution of the round form of the starting plate.

Moreover, by comparison with this rotation-symmetrical distribution profile, the dCTE distribution profile of FIG. 14 shows an interaction with a comparatively slight impairment of the imaging quality of the mirror in cooperation with a non-circular, optically used area CA. This shall be explained in more detail hereinafter:

(a) Bandwidth of Intersection Lines

In FIG. 13, the outline L(CA) of an optically used area CA with rectangular form and rounded-off edges is schematically plotted. Within CA, three intersection lines S1, S2 and S3 that extend through the center 2 are plotted. S1 extends along the short axis of the rectangular form, S2 along the long axis, and S3 along the diagonal.

Figure 15:
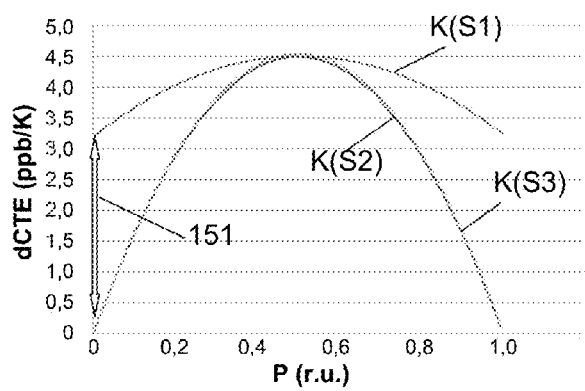
FIG. 15 is a diagram with three curves that show the dCTE evolution of the profile of FIG. 13 along the normalized intersection lines S1, S2, S3.

The diagram of FIG. 15 shows the dCTE distribution profiles along the intersection lines S1 to S3 (within CA). On the ordinate of the diagram, the relevant dCTE value is plotted (in ppb/K) and, on the abscissa, a position value P normalized to the respective intersection line length (in relative units), which thereby covers the range of 0 to 1. It follows that the section profiles K(S2) and K(S3) along the long rectangle axis S2 and along the diagonal S3, respectively, are similar and almost come to lie one upon the other, but both differ considerably from the section profile K(S1) along the short rectangle axis S1. In the respective center region the dCTE values of all sections show a common maximum value with $dCTE_{max}$=4.5 ppb/K (calculated as the difference between maximum value (5 ppb/K) and minimum value (0.5 ppb/K) within CA). At the edge positions 0 and 1, however, there is a great difference that is about 3.3 ppb/K in the maximum (marked with block arrow 151). The maximum 151 represents the maximum bandwidth of the family of curves formed by curves K(S1), K(S2), and K(S3), which is about 73% of $dCTE_{max}$.

Figure 16:
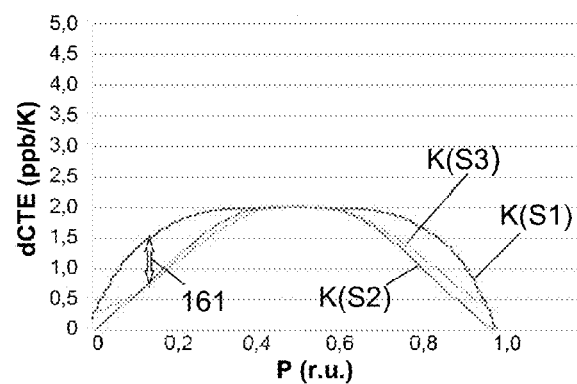
FIG. 16 is diagram with three curves that show the dCTE evolution of FIG. 14 along the normalized intersection lines S1, S2, S3.

The outline L(CA) of the optically used area CA with rectangular form and rounded-off edges is schematically plotted also in the distribution profile of FIG. 14. The centroid of the area of CA lies in the center axis M. The diagram of FIG. 16 shows the dCTE distribution profiles along intersection lines S1 to S3 (within CA) in the case of the dCTE distribution profile of FIG. 14 through the centroid of the area (center M).

In this case, too, the corresponding dCTE value is plotted (in ppb/K) on the ordinate of the diagram, and the position value P normalized to the respective intersection line length (in relative unit) on the abscissa. It is evident from this that the section profiles K(S2) and K(S3) are similar, but differ from the section profile K(S1) along the short rectangle axis S1 less clearly than in the diagram of FIG. 15. The common maximum value $dCTE_{max}$ within the CA area of the sections lies again in the center region, but it is only 2 ppb/K (calculated as the difference between maximum value (5 ppb/K) and minimum value (3 ppb/K) within CA); the maximum difference of the dCTE values of the family of curves at a position (marked with block arrow 161) is only about 0.7 ppb/K. Consequently, the maximum bandwidth of the family of curves formed by the curves K(S1), K(S2), and K(S3) is here about 35% of $dCTE_{max}$. Due to the smaller variations in dCTE and the more uniform profiles of the sections S1 to S3 this distribution profile is distinguished in comparison with FIG. 13/FIG. 15 by a better adaptation to CA and better imaging properties.

(b) Extension of the Isoline with the Level $0.5 \times dCTE_{max}$

Isolines H1, H2, H3 are schematically plotted in FIG. 14; these indicate dCTE values at the same level. Here,
isoline H3 represents a dCTE value of $-1.2 \times dCTE_{max}$,
isoline H2 represents a dCTE value of $0.8 \times dCTE_{max}$, and
isoline H1 represents a dCTE value of $0.5 \times dCTE_{max}$.

It is evident that isoline H1 extends with its whole isoline length within the outline L(CA) of the optically used area CA. Isoline H2 extends with about 15% of its total isoline length outside of CA, whereas isoline H3 extends fully outside of CA, but it does also not belong to the optically exposed area CA.

This means that the contour of the dCTE inhomogeneity profile in the case of the mirror substrate blank of FIG. 14 is matched to the outline L(CA) to the extent that the CA outline L(CA) is intersected by a number of isolines of the distribution profile that is as small as possible.

Thus the blank 14 in combination with its specific, optically used area CA satisfies all conditions of the general design principle according to the invention, namely the demand made on the dCTE distribution profile of the blank and the interaction between the dCTE distribution profile and the optically exposed area CA with non-circular outline L(CA).

Third Embodiment of Method for Producing a Cylindrical Pre-Product for a Mirror Substrate Blank A soot body which is doped with about 8% by wt. of $TiO_2$ is produced with the help of the OVD method by flame hydrolysis of octamethylcyclotetrasiloxane (OMCTS) and titanium isopropoxide [$Ti(O^iPr)_4$] as start substances for the formation of $SiO_2$—$TiO_2$ particles.

In contrast to the above-explained procedures, the surface temperature of the soot body is here slightly varied during the whole deposition process. This small difference leads to a different distribution of the $TiO_2$ concentration.

Example 4

Figure 17:
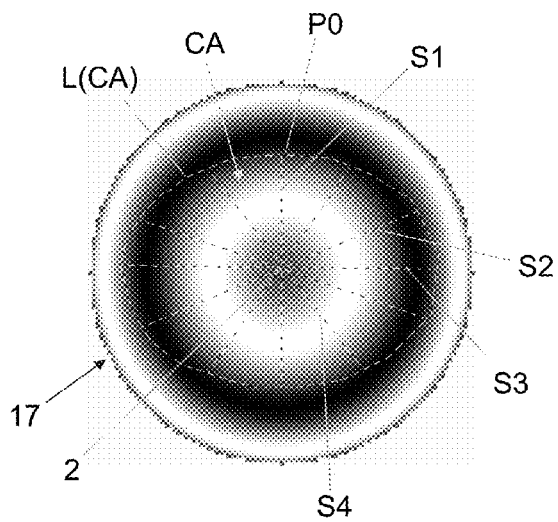
FIG. 17 shows a third rotation-symmetrical dCTE distribution profile with plotted hypothetical CA with elliptical shape and distribution-profile intersection lines S1 to S6.
Figure 18:
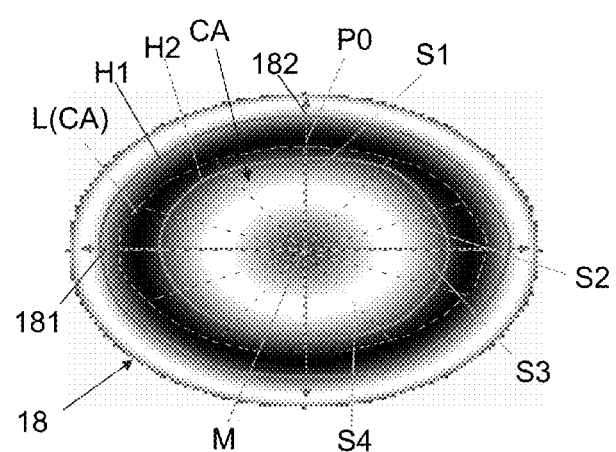
FIG. 18 shows a dCTE distribution profile according to an embodiment of the present invention which has been produced by lateral deformation, with plotted CA with an elliptical shape, isolines and distribution-profile intersection lines.

The starting plate of $TiO_2$—$SiO_2$ glass with a diameter of 200 mm and a thickness of 195 mm is shaped in a furnace by lateral shaping into an oval plate 18, as schematically shown in FIG. 18. To this end the starting plate is centrally inserted into a melt mold of graphite which has an oval inner cross-section, similarly as already explained for Example 1. The lateral deformation by softening and outflowing into the melt mold is carried out as has been explained with reference to Example 1. The stretching factor in the direction of the long oval half-axis 181 as compared with the round plate 17 of the same starting plate, which is schematically shown in FIG. 17, is about 1.5; the stretching factor in the direction of the short axis 182 is virtually equal to 1.

The oval plate 9 obtained thereby consists of homogenized glass having a high-silicic acid content, which contains 8% by wt. of titanium oxide and has a mean hydroxyl group content of around 170 wt. ppm.

The false-color representation in FIG. 18 (as shade of gray with the gray scale of FIG. 1) shows approximately a mirror symmetry with respect to the main axes 181 and 182 of the oval. The dCTE extreme values (5 ppb/K) and (0 ppb/K) are the same as in the original starting plate and in the previously described Examples 1 to 3. "Similarity" exists between the dCTE distribution profiles of the original starting plate and the plate 18 with oval cross-section in the sense that the essential features of the dCTE distribution profile in the oval form, namely the number of the relative and absolute extreme values of the distribution and also the mutual relative position thereof are the same. In this respect the dCTE distribution profile of FIG. 18 already fulfills part of the above-explained basic conditions that form the basis for the design principle for a mirror substrate blank according to this invention. It is not rotation-symmetrical, but by way of "geometric transformation" and in consideration of simple stretching deformations it can be transformed mathematically uniquely into the originally rotation-symmetrical distribution of the round starting plate.

Moreover, by comparison with this rotation-symmetrical distribution profile (which is also manifested by the round plate 17 of FIG. 17), the dCTE distribution profile of FIG. 18 shows an interaction with a comparatively slight impairment of the imaging quality of the mirror in cooperation with a non-circular, optically used area CA. This shall be explained in more detail hereinafter:

(a) Bandwidth of Intersection Lines

In FIG. 17, the outline L(CA) of an optically used area CA is schematically plotted; this outline can also be called elliptical. Within CA, a plurality of intersection lines that extend through the center 2 are plotted, of which the specifically characteristic intersection lines are designated with the reference numerals S1 to S4. The center 2 simultaneously forms the centroid of the area of CA.

Figure 19:
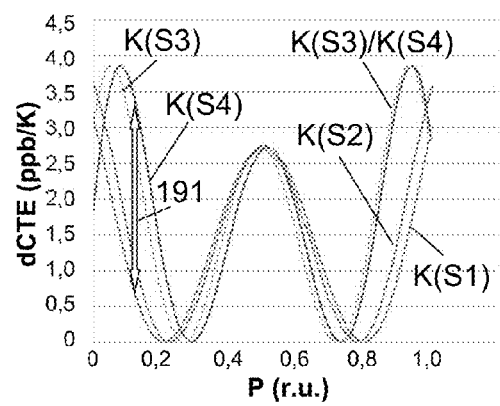
FIG. 19 is a diagram which shows the dCTE evolution of the profile of FIG. 17 along the normalized intersection lines.

The diagram of FIG. 19 shows the dCTE distribution profiles along a representative selection of the intersection lines S1 to S4 (within CA). On the ordinate of the diagram, the relevant dCTE value is plotted (in ppb/K) and, on the abscissa, a position value P normalized to the respective intersection line length (in relative units), which thereby covers the range of 0 to 1. The maximum inhomogeneity $dCTE_{max}$ within CA is 3.8 ppb/K. Clearly different dCTE values in the region of the edge positions 0 and 1 are found between the section profiles K(S1) and K(S3)/K(S4). In the maximum (marked with block arrow 191), the difference is about 2.8 ppb/K. The maximum 191 represents the maximum bandwidth of the family of curves formed by curves K(S1) to K(S4); it is about 74% of $dCTE_{max}$.

Figure 20:
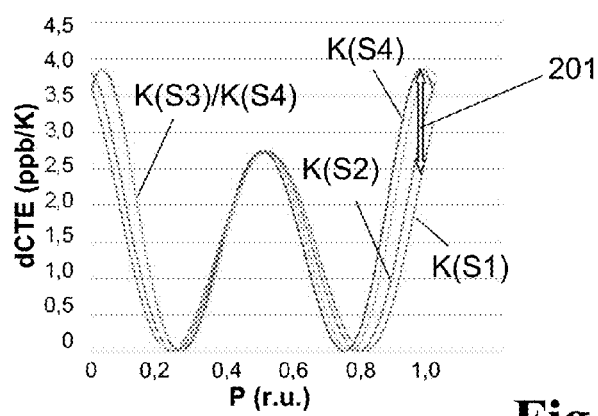
FIG. 20 is a diagram which shows the dCTE evolution of FIG. 18 along the normalized intersection lines.

The outline L(CA) of the optically used area CA with elliptical form is schematically plotted also in the distribution profile of FIG. 18. The centroid of the area of CA lies in point M. The diagram of FIG. 20 shows the dCTE distribution profiles along the intersection lines S1 to S4 (within CA) in the case of the dCTE distribution profile of FIG. 18. In this case, too, the corresponding dCTE value is plotted (in ppb/K) on the ordinate of the diagram, and the position value P normalized to the respective intersection line length (in relative units) on the abscissa. It is evident from this that all of the section profiles K(S1) to K(S4) are relatively similar and form a small curve band. The maximum difference of the dCTE values (marked with block arrow 201) is about 1.3 ppb/K; $dCTE_{max}$ is 3.8 ppb/K. The maximum bandwidth of the family of curves formed by the curves K(S1) to K(S4) (maximum 201) is thus about 34% of $dCTE_{max}$.

The differences in the widths of the bands of the families of curves of FIGS. 19 and 20 are in this case not as striking as in the previous Examples 1 to 3. The amplitudes between dCTE maximum value (about 3.8 ppb/K) and minimum value (0) are also almost identical. It is nevertheless evident that the profile sections K(S1) to K(S4) in the case of the dCTE distribution profile of FIG. 20 within CA show a greater similarity than in the profile of FIG. 19. The greater similarity of the profile sections produces a more uniform distortion of the mirror substrate blank of the invention upon heating and thus accomplishes an easier correction of the imaging errors created thereby.

(b) Extension of the Isoline with the Level $0.5 \times dCTE_{max}$

The dCTE distribution profile of FIG. 18 has two isolines at the level $0.5 \times dCTE_{max}$; a further inwardly extending isoline H2, and an outer isoline fully surrounding the inner isoline. In such profiles the isoline that extends closest to the outline of CA is of relevance to the quality of the adaptation to the non-rotation symmetrical CA. In the profile of FIG. 18, this is the inner isoline H2. In other cases in which it cannot unambiguously be determined which isoline with the level $0.5 \times dCTE_{max}$ extends closer to CA or in the case of which such an isoline does not exist, this criterion for adjusting and assessing the adaptation quality of the dCTE distribution profile to CA is not applicable.

In the case of the distribution profile of FIG. 18, it is discernible that the inner isoline H1 with its total isoline length extends within the outline L(CA) of the optically used area CA. This means that the form of the dCTE inhomogeneity profile in the mirror substrate blank 18 of FIG. 18 is also adapted to the outline L(CA) to the extent that the CA outline L(CA) is intersected by a number of isolines of the distribution profile that is as small as possible.

Thus, blank 18 in combination with its specific, optically used area CA also satisfies all conditions of the general design principle according to the invention, namely the demand made on the dCTE distribution profile of the blank and the interaction between the dCTE distribution profile and the optically used area CA with non-circular outline L(CA).

For the manufacture of a mirror substrate, the top side of the mirror substrate blank is subjected to a mechanical treatment, which includes grinding and polishing. A convexly curved surface area is e.g. produced, of which for instance a pentagonal sub-area, as shown in FIG. 4, is specified as a highly exposed surface area CA with particularly high demands made on the quality of the surface and on the homogeneity of the quartz glass. The curved surface of the mirror substrate is provided with a mirror layer and the mirror element obtained is used in a projection system for EUV lithography.

Figure 21:
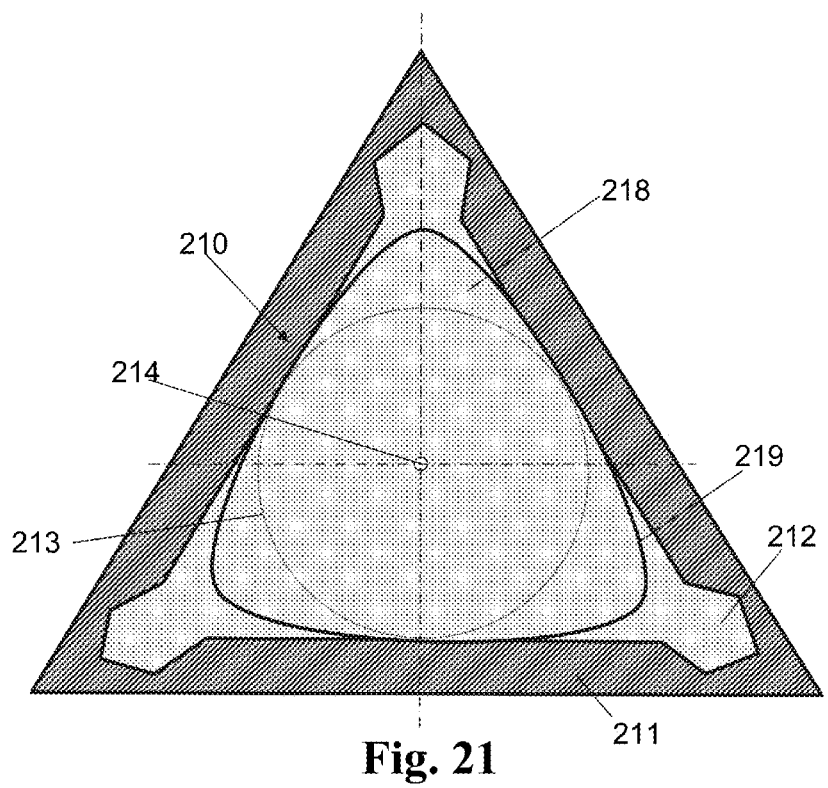
FIG. 21 shows an embodiment of the present invention including a mirror substrate blank with triangular shape, embedded in the melt mold used for production, in a top view.

In all examples, the mirror substrate blank according to the invention has been produced by lateral deformation (stretching) of a round plate. This procedure for a mirror substrate blank 210 with triangular form shall be explained in more detail with reference to FIG. 21. The dCTE distribution profile 100 produced in the blank 210 has a threefold symmetry, wherein the corners of the triangle are widened due to the manufacturing process and removed later.

For the manufacture of the blank 201, a graphite mold 211 is used with an inner geometry that is triangular, but with bulges 212 on the triangle tips. A round plate (outlined by way of the dotted circle 213) is inserted into the graphite mold such that the center axes 214 of round plate 213 and graphite mold 211 extend concentrically. In the case of a non-concentric arrangement, which would alternatively be suited for the production of a mirror substrate blank, this would lead to a deviation from the threefold symmetry of the dCTE distribution profile as is here desired.

The inner geometry of the graphite mold 211 is filled by heating, softening and outflowing of the round plate 213 (as has been explained above with reference to the example of FIG. 4). Due to the bulges 212 of the graphite mold 211 there are flow processes on the corners of the mirror substrate blank 210, which flow processes lead to a stronger shaping of the corners of the resulting dCTE distribution profile, as shown by the contour line 219. In the top view on the optically used area, the contour line 219 outlines the form of a Wankel engine piston or a plectrum. The contour line 219 just symbolizes the form of the dCTE distribution profile (as e.g. defined by a dCTE isoline value which is still within CA). The dCTE distribution profile is also continued outwards outside of the contour line 219.

General Considerations for a Special Case of CA

Special cases of a mirror substrate blank of the invention in which the optically used area CA is substantially defined by two axes a, b that are perpendicular to each other and have different lengths (a>b) have been explained with reference to FIGS. 9 and 14. In such special cases, the CTE inhomogeneity evolution $dCTE_a$ or $dCTE_b$, respectively, in the direction of the two axes can be generally described in conformity with the above-mentioned DE 10 2004 024 808 A1 by the following formulae (2) and (3):

$$dCTEa C_0+C_1(x/a)+C_2(2(x/a)^2-1)+C_3(6(x/a)^4-6(x/a)^2+1) \quad (2)$$

$$dCTEb = C_0+C_2(2(y/b)^2-1)+C_3(6(y/b)^4-6(y/b)^2+1) \quad (3)$$

wherein after deduction of $dCTE_a$ from the really existing CTE inhomogeneity distribution over CA a minimal residual inhomogeneity of not more than 0.5 ppb/K remains. The parameters in formulae (2) and (3) mean:
a=long axis, b=short half-axis and
x=distance along axis a,
y=distance along axis b,
$C_0$, $C_1$, $C_2$, $C_3$=adaptation parameters of the spherical Zernike terms.

However, this general description of non-rotation symmetrical distribution profiles does not replace the above-explained additional requirements regarding the similarity of profile sections through the center of mass of the respective, optically used, non-round CA.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A blank made of titanium-doped silica glass for a mirror substrate for use in EUV lithography, the blank comprising a surface portion configured to be provided with a reflective film and having an optically used area (CA) over which a coefficient of thermal expansion (CTE) has a two-dimensional inhomogeneity (dCTE) distribution profile averaged over a thickness of the blank, a maximum inhomogeneity ($dCTE_{max}$) of less than 5 ppb/K being defined as a difference between a CTE maximum value and a CTE minimum value,
    wherein the $dCTE_{max}$ is at least 0.5 ppb/K,
    wherein the CA forms a non-circular area having a centroid,
    wherein the dCTE distribution profile is not rotation-symmetrical and is defined over the CA such that straight profile sections normalized to a unit length and extending through the centroid of the non-circular area yield a dCTE family of curves forming a curve band with a bandwidth of less than $0.5 \times dCTE_{max}$, and
    wherein the dCTE distribution profile can be mathematically described in a biunique manner by stretching a rotation-symmetrical distribution profile in at least one spatial direction, and wherein the stretching factor is at least 1.2.

2. The blank according to claim 1, wherein the bandwidth is less than $0.3 \times dCTE_{max}$.

3. The blank according to claim 1, wherein the dCTE distribution profile comprises a closed isoline with a dCTE value of 0.5 $dCTE_{max}$, of which a sub-length of at least 80% of a total length of the isoline extends within the CA.

4. The blank according to claim 3, wherein the isoline fully extends within the CA.

5. The blank according to claim 1, wherein the non-circular area of the CA is defined by a non-circular outline along which a dCTE maximum value and a dCTE minimum value of the dCTE distribution profile are positioned, wherein the difference ($PV_{CA}$) between the dCTE maximum value and the dCTE minimum value is not more than $0.5 \times dCTE_{max}$.

6. The blank according to claim 5, wherein the difference $PV_{CA}$ is not more than $0.3 \times dCTE_{max}$.

7. A blank made of titanium-doped silica glass for a mirror substrate for use in EUV lithography, the blank comprising a surface portion configured to be provided with a reflective film and having an optically used area (CA) over which a coefficient of thermal expansion (CTE) has a two-dimensional inhomogeneity (dCTE) distribution profile averaged over a thickness of the blank, a maximum inhomogeneity $dCTE_{max}$) of less than 5 ppb/K being defined as a difference between a CTE maximum value and a CTE minimum value,
    wherein the $dCTE_{max}$ is at least 0.5 ppb/K,
    wherein the CA forms a non-circular area having a centroid,
    wherein the dCTE distribution profile is not rotation-symmetrical and is defined over the CA such that straight profile sections normalized to a unit length and extending through the centroid of the non-circular area yield a dCTE family of curves forming a curve band with a bandwidth of less than $0.5 \times dCTE_{max}$, and
    wherein the dCTE distribution profile can be mathematically described in a biunique manner by stretching the round form in plural spatial directions, and wherein the spatial directions extend in a common deformation plane extending in parallel with the optically used area CA.

8. A blank made of titanium-doped silica glass for a mirror substrate for use in EUV lithography, the blank comprising a surface portion configured to be provided with a reflective film and having an optically used area (CA) over which a coefficient of thermal expansion (CTE) has a two-dimensional inhomogeneity (dCTE) distribution profile averaged over a thickness of the blank, a maximum inhomogeneity ($dCTE_{max}$) of less than 5 ppb/K being defined as a difference between a CTE maximum value and a CTE minimum value,
    wherein the $dCTE_{max}$ is at least 0.5 ppb/K,
    wherein the CA forms a non-circular area having a centroid,
    wherein the dCTE distribution profile is not rotation-symmetrical and is defined over the CA such that straight profile sections normalized to a unit length and extending through the centroid of the non-circular area yield a dCTE family of curves forming a curve band with a bandwidth of less than $0.5 \times dCTE=_{max}$, and
    wherein the dCTE distribution profile can be described by stretching the circular form in three directions extending in the same deformation plane and enclosing an angle of 120 degrees.

9. A method for producing a blank from titanium-doped silica glass for a mirror substrate for use in EUV lithography according to claim 1, the method comprising the following steps:
    (a) providing a glass cylinder of Ti-doped silica glass with a rotation-symmetrical dCTE distribution profile, and
    (b) shaping the glass cylinder by softening the cylinder and forming the softened cylinder under an action of a shaping force having a force component acting in a direction perpendicular to a longitudinal axis of the glass cylinder, thereby stretching the rotation-symmetrical dCTE distribution profile in at least one direction so as to obtain a cylindrical blank which has a non-circular cross-section and a non-rotation symmetrical dCTE distribution profile.

10. The method according to claim 9, wherein the shaping according to step (b) comprises a shaping step in which the glass cylinder along a vertically-oriented longitudinal axis thereof is arranged in a melt mold having a non-rotation symmetrical inner geometry, is heated therein to a temperature of at least 1,200° C. and is softened thereby such that softened glass flows out laterally into the melt mold under the action of gravity.

11. The method according to claim 10, wherein the inner geometry of the melt mold, when viewed in cross section in a direction perpendicular to the longitudinal axis of the glass cylinder, has a long axis and a shorter axis in comparison therewith.

12. The method according to claim 11, wherein the inner geometry of the melt mold is oval or rectangular in cross section.

13. The method according to claim 9, wherein the shaping according to step b) comprises a plurality of shaping steps, wherein the glass body obtained after a first shaping step is further deformed in a second and subsequent shaping step.

14. The method according to claim 9, wherein providing the glass cylinder according to step (a) comprises:
   aa) producing a porous soot body of $SiO_2$ and $TiO_2$ by flame hydrolysis of starting substances containing silicon and titanium,
   bb) drying and sintering the soot body to form an elongated glass pre-product of Ti-doped silica glass,
   cc) homogenizing the glass pre-product in a homogenization process in which the pre-product is heated to a temperature of more than 1,500° C., is softened therein and is shaped into the glass cylinder.

15. The blank according to claim 7, wherein the bandwidth is less than $0.3 \times dCTE_{max}$.

16. The blank according to claim 7, wherein the dCTE distribution profile comprises a closed isoline with a dCTE value of $0.5\ dCTE_{max}$, of which a sub-length of at least 80% of a total length of the isoline extends within the CA.

17. The blank according to claim 8, wherein the bandwidth is less than $0.3 \times dCTE_{max}$.

18. The blank according to claim 8, wherein the dCTE distribution profile comprises a closed isoline with a dCTE value of $0.5\ dCTE_{max}$, of which a sub-length of at least 80% of a total length of the isoline extends within the CA.

19. A method for producing a blank from titanium-doped silica glass for a mirror substrate for use in EUV lithography, the blank comprising a surface portion configured to be provided with a reflective film and having an optically used area (CA) over which a coefficient of thermal expansion (CTE) has a two-dimensional inhomogeneity (dCTE) distribution profile averaged over a thickness of the blank, a maximum inhomogeneity ($dCTE_{max}$) of less than 5 ppb/K being defined as a difference between a CTE maximum value and a CTE minimum value,
   wherein the $dCTE_{max}$ is at least 0.5 ppb/K,
   wherein the CA forms a non-circular area having a centroid,
      wherein the dCTE distribution profile is not rotation-symmetrical and is defined over the CA such that straight profile sections normalized to a unit length and extending through the centroid of the non-circular area yield a dCTE family of curves forming a curve band with a bandwidth of less than $0.5 \times dCTE_{max}$,
   the method comprising the following steps:
   (a) providing a glass cylinder of Ti-doped silica glass with a rotation-symmetrical dCTE distribution profile, and
   (b) shaping the glass cylinder by softening the cylinder and forming the softened cylinder under an action of a shaping force having a force component acting in a direction perpendicular to a longitudinal axis of the glass cylinder, thereby stretching the rotation-symmetrical dCTE distribution profile in at least one direction so as to obtain a cylindrical blank which has a non-circular cross-section and a non-rotation symmetrical dCTE distribution profile,
   wherein the shaping comprises a plurality of shaping steps, wherein the glass body obtained after a first shaping step is further deformed in a second and subsequent shaping step.

20. A method for producing a blank from titanium-doped silica glass for a mirror substrate for use in EUV lithography, the blank comprising a surface portion configured to be provided with a reflective film and having an optically used area (CA) over which a coefficient of thermal expansion (CTE) has a two-dimensional inhomogeneity (dCTE) distribution profile averaged over a thickness of the blank, a maximum inhomogeneity ($dCTE_{max}$) of less than 5 ppb/K being defined as a difference between a CTE maximum value and a CTE minimum value,
   wherein the $dCTE_{max}$ is at least 0.5 ppb/K,
   wherein the CA forms a non-circular area having a centroid,
      wherein the dCTE distribution profile is not rotation-symmetrical and is defined over the CA such that straight profile sections normalized to a unit length and extending through the centroid of the non-circular area yield a dCTE family of curves forming a curve band with a bandwidth of less than $0.5 \times dCTE_{max}$,
   the method comprising the following steps:
   (a) providing a glass cylinder of Ti-doped silica glass with a rotation-symmetrical dCTE distribution profile, and
   (b) shaping the glass cylinder by softening the cylinder and forming the softened cylinder under an action of a shaping force having a force component acting in a direction perpendicular to a longitudinal axis of the glass cylinder, thereby stretching the rotation-symmetrical dCTE distribution profile in at least one direction so as to obtain a cylindrical blank which has a non-circular cross-section and a non-rotation symmetrical dCTE distribution profile,
   wherein providing the glass cylinder according to step (a) comprises:
      aa) producing a porous soot body of $SiO_2$ and $TiO_2$ by flame hydrolysis of starting substances containing silicon and titanium,
      bb) drying and sintering the soot body to form an elongated glass pre-product of Ti-doped silica glass,
      cc) homogenizing the glass pre-product in a homogenization process in which the pre-product is heated to a temperature of more than 1,500° C., is softened therein and is shaped into the glass cylinder.

* * * * *